(12) United States Patent
Mattzela (10) Patent No.: US 9,340,880 B2
(45) Date of Patent: May 17, 2016

(54) SEMICONDUCTOR FABRICATION PROCESS

(71) Applicant: SILCOTEK CORP., Bellefonte, PA (US)

(72) Inventor: James B. Mattzela, Port Matilda, PA (US)

(73) Assignee: Silcotek Corp., Bellefonte, PA (US)

( * ) Notice: Subject to any disclaimer, the term of this patent is extended or adjusted under 35 U.S.C. 154(b) by 91 days.

(21) Appl. No.: 14/464,748

(22) Filed: Aug. 21, 2014

(65) Prior Publication Data

US 2014/0357091 A1 Dec. 4, 2014

Related U.S. Application Data

(63) Continuation-in-part of application No. 13/504,533, filed as application No. PCT/US2010/054058 on Oct. 26, 2010, application No. 14/464,748, which is a continuation-in-part of application No. 13/876,328, filed as application No. PCT/US2011/054835 on Oct. 5, 2011, application No. 14/464,748, which is a continuation-in-part of application No. PCT/US2013/033807, filed on Mar. 26, 2013.

(60) Provisional application No. 61/255,237, filed on Oct. 27, 2009, provisional application No. 61/267,228, filed on Dec. 7, 2009, provisional application No. 61/389,777, filed on Oct. 5, 2010, provisional application No. 61/507,650, filed on Jul. 14, 2011, provisional application No. 61/615,559, filed on Mar. 26, 2012.

(51) Int. Cl.
| | |
|---|---|
| *H01L 21/02* | (2006.01) |
| *C23C 16/56* | (2006.01) |
| *B05D 1/00* | (2006.01) |
| *C23C 16/22* | (2006.01) |
| *C09D 7/00* | (2006.01) |

(52) U.S. Cl.
CPC . *C23C 16/56* (2013.01); *B05D 1/60* (2013.01); *C23C 16/22* (2013.01); *C09D 7/00* (2013.01)

(58) Field of Classification Search
None
See application file for complete search history.

(56) References Cited

U.S. PATENT DOCUMENTS

| | | |
|---|---|---|
| 4,749,631 A | 6/1988 | Haluska et al. |
| 4,753,856 A | 6/1988 | Haluska et al. |

(Continued)

FOREIGN PATENT DOCUMENTS

| | | |
|---|---|---|
| EP | 1150345 A2 | 10/2001 |
| EP | 1988190 A2 | 11/2008 |

(Continued)

OTHER PUBLICATIONS

Restek Performance Coatings Service Through Technology, www.restekcorp.com, 2003, 1 pg.

(Continued)

*Primary Examiner* — Seahvosh Nikmanesh
(74) *Attorney, Agent, or Firm* — McNees Wallace & Nurick LLC (57) ABSTRACT

Semiconductor fabrication processes are described. An embodiment of the semiconductor fabrication process includes providing a layer formed by decomposition of dimethylsilane through chemical vapor deposition, the layer being applied by a fluid material, and then positioning the layer in a system for producing a semiconductor product. Additionally or alternatively, the semiconductor product is produced and/or the layer is on a substrate.

19 Claims, 7 Drawing Sheets

(56) References Cited

U.S. PATENT DOCUMENTS

| | | | |
|---|---|---|---|
| 4,842,888 | A | 6/1989 | Haluska et al. |
| 5,160,544 | A | 11/1992 | Garg et al. |
| 5,249,554 | A | 10/1993 | Tamor et al. |
| 5,270,082 | A | 12/1993 | Lin et al. |
| 5,481,135 | A | 1/1996 | Chandra et al. |
| 5,563,102 | A | 10/1996 | Michael |
| 5,818,071 | A | 10/1998 | Loboda et al. |
| 5,825,078 | A | 10/1998 | Michael |
| 6,159,871 | A | 12/2000 | Loboda et al. |
| 6,444,326 | B1 | 9/2002 | Smith |
| 6,511,760 | B1 | 1/2003 | Barone et al. |
| 6,593,655 | B1 | 7/2003 | Loboda et al. |
| 7,070,833 | B2 | 7/2006 | Smith et al. |
| 2003/0186000 | A1 | 10/2003 | Li et al. |
| 2005/0130416 | A1* | 6/2005 | Fujisawa ............ B60R 16/0207 438/680 |
| 2005/0271893 | A1 | 12/2005 | Kobrin et al. |
| 2009/0230558 | A1 | 9/2009 | Matsuoka |
| 2012/0251797 | A1 | 10/2012 | Smith et al. |
| 2013/0244025 | A1 | 9/2013 | Smith et al. |

FOREIGN PATENT DOCUMENTS

| | | |
|---|---|---|
| WO | 2009032488 A1 | 3/2009 |
| WO | 2009143618 A1 | 12/2009 |

OTHER PUBLICATIONS

D.A. Smith, D. Shelow and G. Barone, "Instrument and Sampling Equipment Passivation Requirements to Meet Current Demands for Low-Level Sulfur Analysis," 2001, 37 pgs.

Fast Facts At-a-Glance Product Information from Restek, Silcosteel—UHV, Dramatically Reduce Outgassing in UHV Systems, www.restekcorp.com, 2001, 2 pgs.

Fast Facts At-a-Glance Product Information from Restek, Silcosteel-CR, Achieve Specialty Alloy Performance Using Austenitic Stainless Steels, www.restekcorp.com, 2004, 4 pgs.

D.A. Smith, G.B. Stidsen, B. Burger and D. Shelow, "The Containment and Transfer of Trace Sulfur Gases at Low-PPBV Levels," 2001, 37 pgs.

G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.

G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.

R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.

R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.

V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

D. A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

W. Bertsch and V. Pretorius, "Deactivation of Metal Surfaces for Capillary Columns for GC by Deposition of Silicon," Journal of HRC&CC, 1982, 3 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

Vasin A V et al: "Light-emitting properties of amorphous Si:C:O:H layers fabricated by oxidation of carbon-rich a-Si:C:H films", Solid State Sciences, Elsevier, Paris, FR, vol. 11, No. 10, Oct. 1, 2009, pp. 1833-1837, XP026653063, ISSN: 1293-2558, DOI:DOI:10,1016/J. SOLIDSTATESCIENCES. 2009.05.030.

Narita et al: "Interpretation of initial stage of 3C-SiC growth on Si(100) using dimethylsilane", Applied Surface Science, Elsevier, Amsterdam, NL, vol. 252, No. 10, Mar. 15, 2006, pp. 3460-3465, XP005294988, ISSN: 0169-4332, COI:DOI:10. 1016/J.APSUSC. 2005.05.021.

Shinohara M et al: "Infrared study of carbon incorporation during chemical vapor deposition of SiC using methylsilanes", Applied Surface Science Elsevier Netherlands, vol. 175-176, May 15, 2001, pp. 591-596, XP002620548, ISSN: 0169-4332.

H.E. O'Neal and M.A. Ring, "Mechanism of the Thermal Decomposition of Dimethylsilane at Atmospheric Pressures in the Gas Phase", Organometallics, American Chemical Society, vol. 7, No. 5, May 1988, pp. 1017-1025.

\* cited by examiner

SEMICONDUCTOR FABRICATION PROCESS

CROSS-REFERENCES TO RELATED APPLICATIONS

The present disclosure is a continuation-in-part of U.S. patent application Ser. No. 13/504,533, filed Apr. 27, 2012, and titled "CHEMICAL VAPOR DEPOSITION COATING, ARTICLE, AND METHOD", which claimed priority to, and the benefit of, U.S. Provisional Patent Application No. 61/255,237, filed Oct. 27, 2009, and titled "DIMETHYLSILANE CHEMICAL VAPOR DEPOSITION COATING AND COATING PROCESS", and U.S. Provisional Patent Application No. 61/267,228, filed Dec. 7, 2009, and titled "OXIDIZED VAPOR DEPOSITION COATING AND COATING PROCESS"; is a continuation-in-part of U.S. patent application Ser. No. 13/876,328, filed May 23, 2013, and titled "WEAR RESISTANT COATING, ARTICLE, AND METHOD", which claimed priority to, and the benefit of, U.S. Provisional Patent Application No. 61/389,777, filed Oct. 5, 2010, and titled "CHEMICAL VAPOR DEPOSITION COATING, ARTICLE, AND METHOD", and U.S. Provisional Patent Application No. 61/507,650, filed Jul. 14, 2011, and titled "WEAR RESISTANT COATING, ARTICLE, AND METHOD"; and claims priority to, and the benefit of, International Application No. PCT/US13/33807, filed Mar. 26, 2013, and titled "Coated Article and Chemical Vapor Deposition Process", which claimed priority to and the benefit of U.S. Provisional Patent Application No. 61/615,559, filed Mar. 26, 2012, and titled "Coating, Coated Article, and Method of Applying a Coating," all of which are hereby incorporate by reference in their entirety.

FIELD

The present disclosure is directed to semiconductor fabrication processes, more particularly, semiconductor fabrication processes that include positioning a functionalized layer in a system for producing semiconductor products.

BACKGROUND

Often, surfaces of substrates do not include desired performance characteristics. The failure to include specific desired performance characteristics can result in surface degradation in certain environments, an inability to meet certain performance requirements, or combinations thereof. For example, in certain environments, metallic, glass, and ceramic surfaces can be subjected to wear and other undesirable surface activities such as chemical adsorption, catalytic activity, corrosive attack, oxidation, by-product accumulation or stiction, and/or other undesirable surface activities.

Undesirable surface activities can cause chemisorption of other molecules, reversible and irreversible physisorption of other molecules, catalytic reactivity with other molecules, attack from foreign species, a molecular breakdown of the surface, physical loss of substrate, or combinations thereof.

To provide certain desired performance characteristics, a silicon hydride surface and unsaturated hydrocarbon reagents can be reacted in the presence of a metal catalyst. Such processes suffer from the drawbacks that complete removal of this catalyst from the treated system is often difficult and the presence of the catalyst can re-introduce undesirable surface activity. Amorphous silicon-based chemical vapor deposition materials are also susceptible to dissolution by caustic high pH media, thereby limiting their use in such environments.

A coating may be applied to a surface to protect it from undesirable surface activities. One known method of depositing a coating on a surface is chemical vapor deposition (CVD). Generally, CVD deposits a solid material from a vapor under controlled atmospheric and temperature conditions for a predetermined time to form a coating. CVD can include a primary treatment followed by functionalization (a surface reaction) to add predetermined molecules.

However, despite the prior use of CVD generally, molecules, including silicon, carbon, and hydrogen, have previously been considered undesirable for use as CVD precursors or have been applied in conjunction with other CVD precursors in the presence of additional depositional energies, such as plasma and microwave fields. Thus, properties associated with such molecules have previously been unrealized through thermal CVD technology.

Such drawbacks have prevented applicability in certain fields, such as, semiconductor fabrication processes. Layers on surfaces that materials contact in the semiconductor fabrication processes can result in undesirable effects for the process, such as, metal ion contamination and corrosive attack of processing substrates.

Accordingly, a semiconductor fabrication process that does not suffer from one or more of the above drawbacks would be desired in the art.

SUMMARY

According to an embodiment of the present disclosure, a semiconductor fabrication process includes providing a coated article, the coated article having a substrate and a layer applied to the substrate by decomposition of dimethylsilane through chemical vapor deposition, the layer applied by a fluid material, and then positioning the coated article in a system for producing a semiconductor product.

According to another embodiment of the present disclosure, a semiconductor fabrication process includes providing a coated article, the coated article having a substrate and a layer applied to the substrate by decomposition of dimethylsilane through chemical vapor deposition, the layer being applied by a fluid material, and then positioning the coated article in a system, and then producing a semiconductor product from the system.

According to another embodiment of the present disclosure, a semiconductor fabrication process includes providing a layer applied by decomposition of dimethylsilane through chemical vapor deposition, the layer being applied by a fluid material, and then positioning the layer in a system, and then producing a semiconductor product from the system.

Further aspects of embodiments of the invention are disclosed herein. The features as discussed above, as well as other features and advantages of the present application, will be appreciated and understood by those skilled in the art from the following drawings and detailed description.

BRIEF DESCRIPTION OF THE DRAWINGS

Wherever possible, the same reference numbers will be used throughout the drawings to represent the same parts.

DETAILED DESCRIPTION OF EXEMPLARY EMBODIMENTS

Provided is semiconductor fabrication process. Embodiments of the present disclosure, in comparison to similar concepts failing to include one or more of the features discloses herein, permit coatings to include additional properties relating to hardness, permit coatings to include additional properties relating to inertness, permit coatings to include additional properties relating to chemical corrosive resistance, permit coatings to include additional properties relating to tailorability, permit coatings to include additional properties relating to hydrophobicity, permit coatings to include additional properties relating to pH resistance, permit coatings to include additional properties relating to anti-corrosiveness, permit coatings to include additional properties relating to anti-stiction, permit coatings to include additional properties relating to anti-coking, permit coatings to include additional properties relating to wear resistance, permit coatings to reduce or eliminate metal ion contamination, or a combination thereof.

Figure 1:
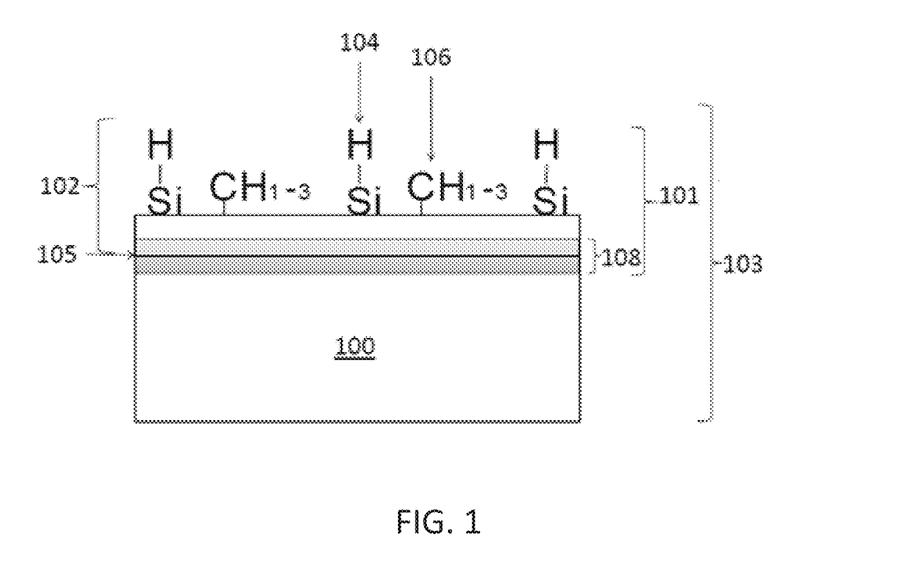
FIG. 1 shows a schematic view of an article having a coating with a layer formed from decomposition of a material according to an embodiment of the disclosure.
Figure 3:
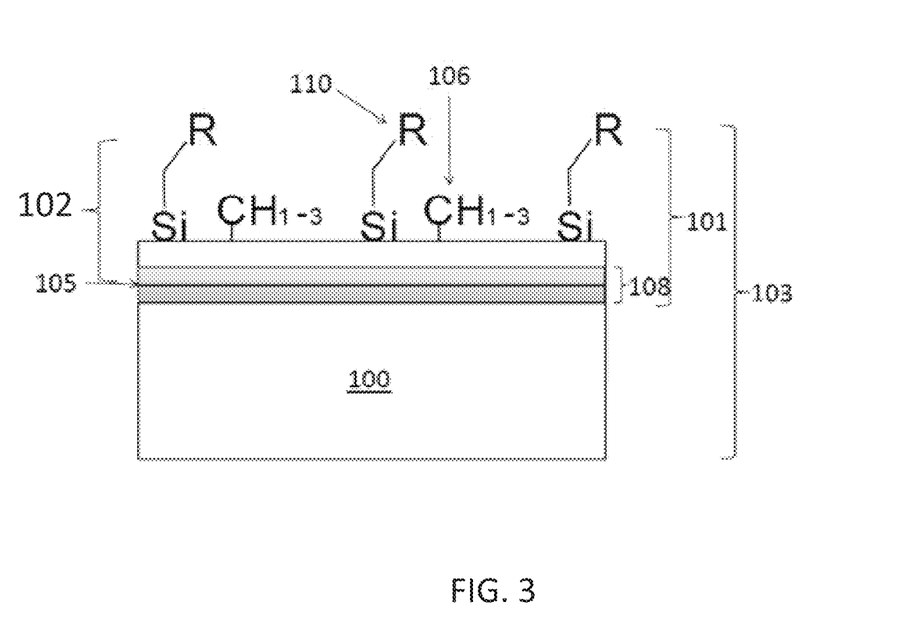
FIG. 3 shows a schematic view of an article having a coating with a functionalized layer formed according to an embodiment of the disclosure.
Figure 4:
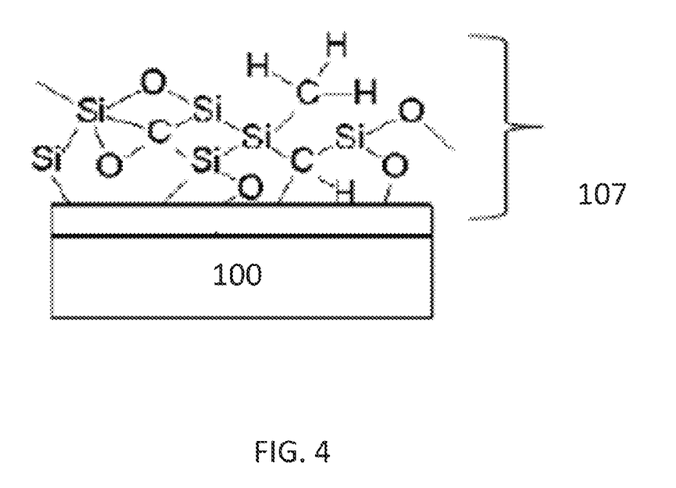
FIG. 4 shows a schematic view of an article having a coating with a oxidized layer formed according to an embodiment of the disclosure.
Figure 5:
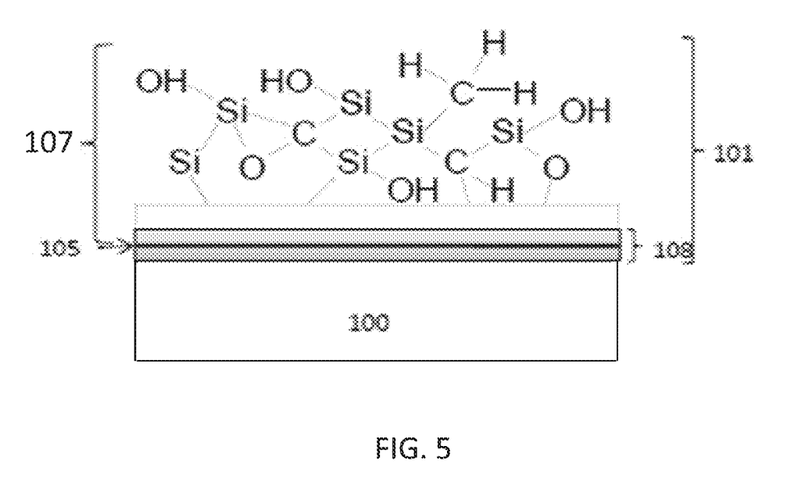
FIG. 5 shows a schematic view of an article having a coating with a oxidized layer formed according to an embodiment of the disclosure.
Figure 6:
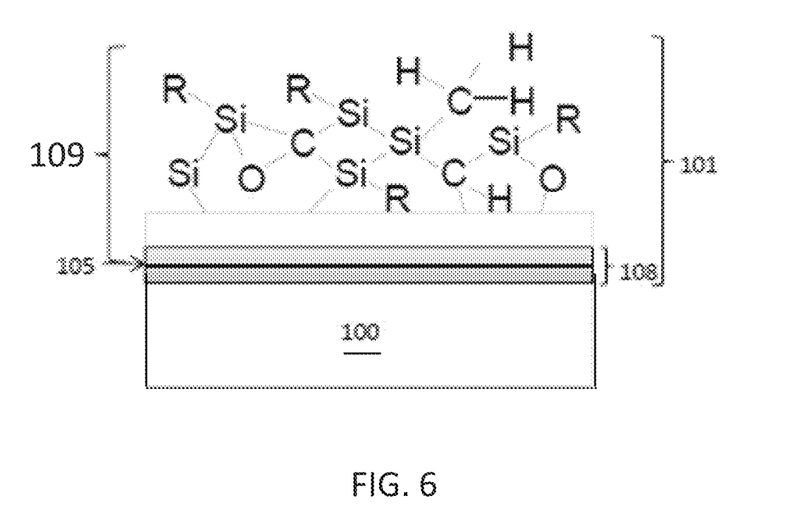
FIG. 6 shows a schematic view of an article having a coating with an oxidized-then-functionalized layer formed according to an embodiment of the disclosure.
Figure 7:
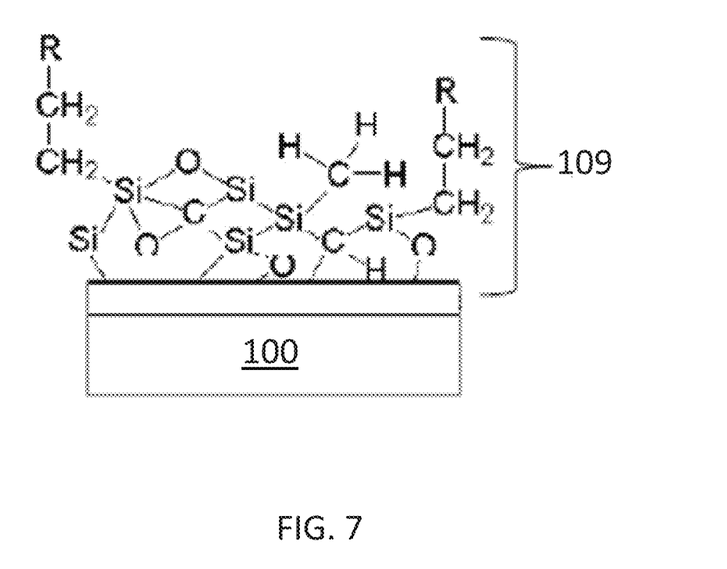
FIG. 7 shows a schematic view of an article having a coating with an oxidized-then-functionalized layer formed according to an embodiment of the disclosure.

A coating process 200 (see FIG. 2) forms a coating 101 on a substrate 100 of an article 103, for example, as is shown in FIG. 1. The article 103 includes a surface 105 having surface properties achieved through the coating process 10 controllably depositing a layer 102. The layer 102 imparts a surface effect to the substrate 100, the coating 101, the article 103, or combinations thereof. The surface effect is provided by diffusion of the layer 102 and/or the coating 101 into the surface 105 of the substrate 100. The substrate 100 is any suitable substrate, such as, a metallic substrate (ferrous or non-ferrous), stainless steel, a glass substrate, a ceramic substrate, ceramic matrix composite substrate, a composite metal substrate, a coated substrate, a fiber substrate, a foil substrate, a film, or a combination thereof. In one embodiment, as is shown in FIG. 3, the coating process 200 forms a functionalized layer 110 from the layer 102. In one embodiment, as is shown in FIG. 4-5, the coating process 200 forms an oxidized layer 107 from the layer 102. In one embodiment, as is shown in FIG. 6-7, the coating process 200 forms an oxidized-then-functionalized layer 109 from the oxidized layer 107.

Figure 2:
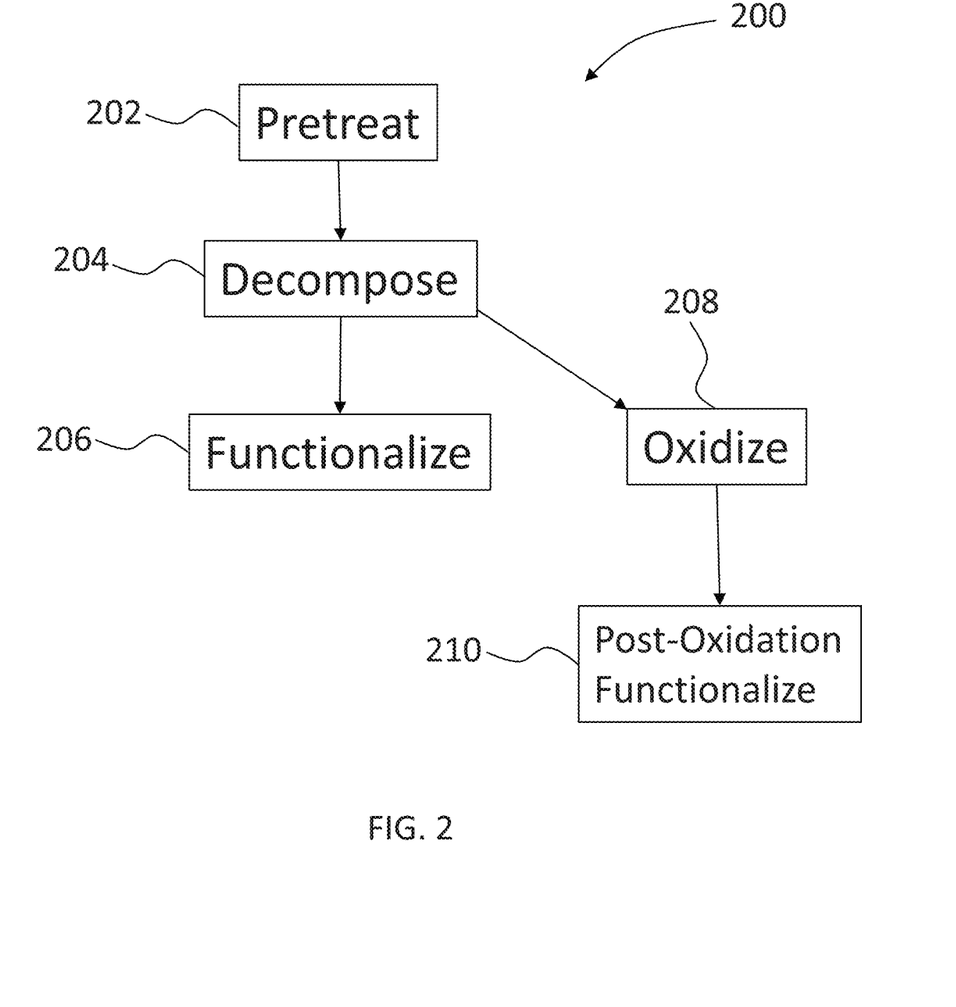
FIG. 2 shows a schematic view of a process according to an embodiment of the disclosure.

Referring to FIG. 2, the coating process 200 includes pretreatment (step 202), decomposition (step 204), functionalization (step 206), oxidation (step 208), post-oxidation functionalization (step 210), post-functionalization oxidation, or a combination thereof. In one embodiment, the coating process 200 includes, consist of, or consists essentially of the pretreatment (step 202) and the decomposition (step 204). In one embodiment, the coating process 200 includes, consist of, or consists essentially of the pretreatment (step 202), the decomposition (step 204), and the functionalization (step 206). In one embodiment, the coating process 200 includes, consist of, or consists essentially of the pretreatment (step 202), the decomposition (step 204), the oxidation (step 208), and the post-oxidation functionalization (step 210). In one embodiment, the coating process 200 includes, consist of, or consists essentially of the pretreatment (step 202), the decomposition (step 204), the functionalization (step 206), the oxidation (step 208), and the post-oxidation functionalization (step 210). The pretreatment (step 202) is or includes any suitable techniques taken to prepare a chamber, the surface 105, the substrate 100, or a combination thereof. In one embodiment, the chamber is a chemical vapor deposition chamber, for example, with tubing connections to allow gas flow in and out of the chemical vapor deposition chamber. In a further embodiment, the chamber includes multiple controlled inlets and outlets configured for providing and removing multiple gas streams and/or a vacuum connected to one or more outlet tubes.

Suitable techniques for the pretreatment (step 202) include, but are not limited to, cleaning, pre-heating, isolating the substrate 100 and/or the surface 105, surface treatment techniques, evacuating the chamber (for example, with the flow of gas and/or maintenance of a vacuum in the chamber providing a controlled atmosphere), flushing/purging the chamber (for example, with an inert gas such as nitrogen, helium, and/or argon), or a combination thereof. In one embodiment, a heat source controls the temperature in the chamber, for example, to desorb water and remove contaminants from the surface 105. In one embodiment, the heating is at a predetermined temperature above about 100° C. (for example, about 450° C.) and/or at a predetermined pressure (for example, between about 1 atmosphere and about 3 atmospheres, between about 1 atmosphere and about 2 atmospheres, between about 2 atmospheres and about 3 atmospheres, about 1 atmosphere, about 2 atmospheres, about 3 atmospheres, or any suitable combination, sub-combination, range, or sub-range therein). In one embodiment, the heating is for a predetermined period (for example, between about 3 minutes and about 15 hours, between about 0.5 hours and about 15 hours, for about 3 minutes, for about 0.5 hours, for about 2 hours, for about 15 hours, or any suitable combination, sub-combination, range, or sub-range therein).

The decomposition (step 204) is or includes thermal decomposition of one or more precursor materials. In one embodiment, the precursor material is or includes dimethylsilane, for example, in gaseous form. In general, dimethylsilane is not readily obtainable due to the low demand for it. Dimethylsilane has been regarded as undesirable in some chemical vapor deposition applications because it includes carbon and is much more expensive than silane. Silane and the monomethyl analogue to dimethylsilane, methylsilane, are both pyrophoric and may explode in air. Dimethylsilane, although flammable, is not pyrophoric. Thus, use of dimethylsilane decreases safety risks. In addition, use of dimethylsilane results in inertness of a coating and/or chemical resistance, thereby protecting the surface 105 of the substrate 100. Other suitable precursor materials include, but are not limited to, trimethylsilane, dialkylsilyl dihydride, alkylsilyl trihydride, and combinations thereof. In one embodiment, the materials are non-pyrophoric, for example, dialkylsilyl dihydride and/or alkylsilyl trihydride.

The decomposition (step 204) includes any suitable decomposition parameters corresponding to the precursor material, for example, as is described in U.S. Pat. No. 6,444,326, which is incorporated herein by reference in its entirety. If a thicker deposition of the layer 102 is desired, the deposition (step 202) temperature, the deposition (step 202) pressure, the deposition (step 202) time, or a combination thereof are increased or decreased. Suitable thicknesses of the coating 101 include, but are not limited to, between about 100 nm and about 10,000 nm, between about 200 nm and about 5,000 nm, between about 300 nm and about 1500 nm, or any suitable combination, sub-combination, range, or sub-range therein.

Additionally or alternatively, in one embodiment, a plurality of the layers 102 are applied by repeating the deposition (step 202). In one embodiment, the decomposition (step 204) pressure is between about 0.01 psia and about 200 psia, 1.0 psia and about 100 psia, 5 psia and about 40 psia, about 1.0 psia, about 5 psia, about 40 psia, about 100 psia, 200 psia, or any suitable combination, sub-combination, range, or sub-range therein. In one embodiment, the decomposition (step 204) temperature is between about 200° C. and 600° C., between about 300° C. and 600° C., between about 400° C. and about 500° C., about 300° C., about 400° C., about 500° C., about 600° C., or any suitable combination, sub-combination, range, or sub-range therein. In one embodiment, the decomposition (step 204) period is for a duration of about 10 minutes to about 24 hours, about 30 minutes to about 24 hours, about 10 minutes, about 30 minutes, about 15 hours, about 24 hours, or any suitable combination, sub-combination, range, or sub-range therein.

The decomposition (step 204) forms the layer 102, for example, having improved chemical resistance, improved inertness, and/or improved adhesion over non-diffusion coatings and/or coatings not having the thermally decomposed material. The layer 102 includes any suitable thermally decomposed material corresponding to the precursor material. The thermally decomposed material is formed by the decomposition (step 204) at a predetermined pressure and a predetermined temperature sufficient to decompose the precursor material, thereby depositing constituents from the thermally decomposed material onto the substrate 100, for example, with an inert gas such as nitrogen, helium, and/or argon, as a partial pressure dilutant.

In one embodiment, the thermally decomposed material is or includes carbosilane (for example, amorphous carbosilane), corresponding to the precursor including the dimethylsilane, which, although not intending to be bound by theory, is believed to be a recombination of carbosilyl (disilyl or trisilyl fragments) formed from the carbosilane. In one embodiment, the thermally decomposed material includes molecules, such as, silicon, carbon, and hydrogen atoms, that serve as active sites. The molecules are positioned within the layer 102 and include a first portion 104 and a second portion 106. Generally, the first portion 104 and the second portion 106 of the layer 102 are not spatially resolvable (for example, the first portion 104 and the second portion 106 are defined by the molecules deposited on the layer 102 and the molecules are capable of being interspersed throughout the layer 102). Furthermore, use of the terms "first" and "second" is not intended to imply any sequentiality, difference in quantity, difference in size, or other distinction between the two portions. To the contrary, the terms "first" and "second" are used for distinguishing molecular composition of the two portions. For example, in one embodiment, as is shown in FIG. 1, the first portion 104 includes silicon and the second portion 106 includes carbon. In one embodiment, the first portion 104 and the second portion 106 are bound together randomly throughout the layer 102.

Figure 8:
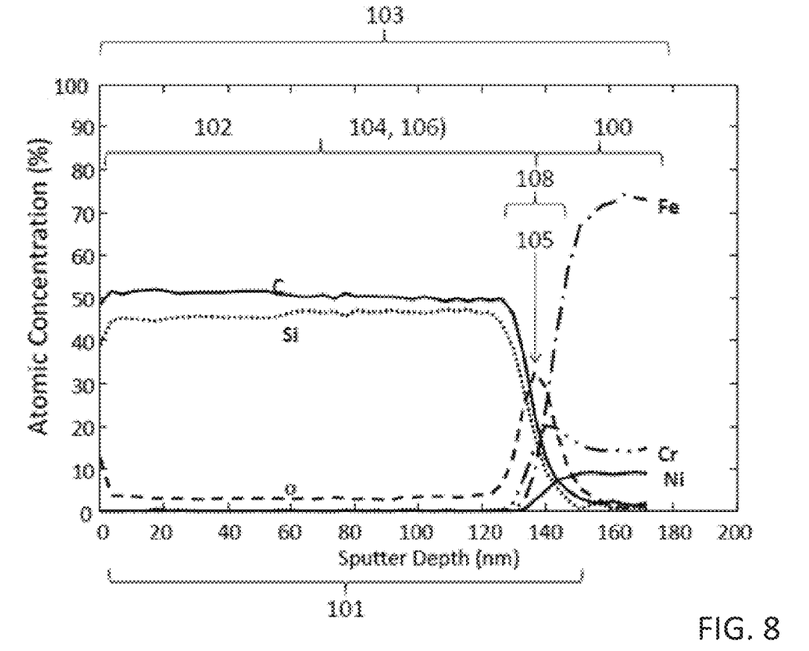
FIG. 8 shows an Auger Electron Spectroscopy plot of an article having a layer formed from decomposition of material according to an embodiment of the disclosure.

FIG. 8 shows the composition of an embodiment throughout the article 103 by Auger Electron Spectroscopy measurements according to an embodiment of the disclosure. FIG. 8 shows a diffusion region 108 within the article 103. It will be appreciated that precise measurement of the diffusion layer 108 via Auger Electron Spectroscopy can be offset by surface roughness of the substrate and coating and that the results shown are merely representative of one embodiment falling within the disclosure. Therefore, the diffusion region 108, as measured by Auger Electron Spectroscopy, is not an absolute measurement but a representation of the diffusion mechanism, according to the coating process 200.

In one embodiment, the composition of the layer 102 is about 1:0.95:0.12 ratio of C:Si:O. In contrast, the composition of the dimethylsilane introduced into the chemical vapor deposition chamber according to an embodiment has about a 2:1 ratio of C:Si. Although not intending to be bound by theory, it is believed that $CH_x$ (x=0–3) moieties are retained and Si—C bonds are broken thus indicating that layer 102 includes an amorphous array of Si—C bonding. The amorphous array provides additional benefits such as decreased cracking or flaking, for example, upon tensile or compressive forces acting on the substrate 100, increased adhesion, or a combination thereof. In one embodiment, multiple layers of the coating 101, or similar coatings, are deposited for thicker layers or for desired properties.

In one embodiment, upon the thermally decomposed materials forming the layer 102 through the decomposition (step 204), the chamber is purged. The purging removes remaining decomposition materials, unbound thermally decomposed materials, and/or other materials or constituents present within the chamber.

The functionalization (step 206) is a separate step from the decomposition (step 204) and modifies the layer 102, for example, as is shown in the embodiment shown in FIG. 3, to form a functionalized layer 110. Suitable thicknesses of the functionalized layer 110 include, but are not limited to, between about 100 nm and about 10,000 nm, between about 200 nm and about 5,000 nm, between about 300 nm and about 1500 nm, or any suitable combination, sub-combination, range, or sub-range therein. The functionalization (step 206) begins with purging of the chamber, heating the chamber to a predetermined temperature, evacuating the chamber, or any other suitable operational parameters described above with reference to the decomposition (step 204).

In the functionalization (step 206), a binding agent is introduced into the chamber. The binding agent reacts with and/or binds to the layer 102 or portions of the layer 102 to form the functionalized layer 110, for example, a carbosilyl surface formed by silicon hydride moieties. In one embodiment, residual moieties from the decomposition (step 204) are reacted, for example, silicon hydride and/or silicon hydride functionality (disilyl or trisilyl) being reacted with $H_2C=C-R$, $HC\equiv C-R$, or a combination thereof. In one embodiment, the R-groups bonded to all or a part of the first portion 104 are formed by hydrocarbons, substituted hydrocarbons (for example, halogenated), carbonyls, carboxyls, esters, ethers, amines, amides, sulfonic acids, organometalic complexes, epoxides, or a combination thereof. Molecules of the binding agent bind to the layer 102 to form the functionalized layer 110, for example, having a carbon-silicon covalent bond with an R-group. Other suitable binding agents include, but are not limited to, ethylene, propylene, substituted unsaturated organic molecules, organic reagents having one or more unsaturated hydrocarbon groups, or a combination thereof.

In one embodiment, the R-group is modified to adjust the properties of the surface 105, for example, to increase the hydrophobicity of the surface 105 by using a fluorinated hydrocarbon as the R-group. In one embodiment, the fluorinated hydrocarbon forms a hydrophobic surface, an oleophobic surface, or a combination thereof. Although not intending to be bound by theory, it is believed that the moieties of silicon hydride can thermally react, through an unsaturated functionality such as hydrosilyation, with unsaturated hydrocarbon groups covalently bonding to the layer 102 to form the functionalized layer 110. The functionalized layer 110 includes covalently-bound R-groups, which includes the R-group and carbon, silicon, and hydrogen moieties. Additionally or alternatively, in one embodiment, the R-group includes an organometallic substituent providing catalytic and/or biocidal properties.

The oxidation (step 208) or the post-functionalization oxidation is or includes exposure to any suitable chemical species or oxidation reagent capable of donating a reactive oxygen species under predetermined oxidation conditions to form the oxidized layer 107. The oxidation (step 208) is of the layer 102 and forms the functionalized layer 110 shown in FIG. 3. The post-functionalization oxidation is of the functionalized layer 110 and forms a functionalized-then oxidized layer (not shown). In an embodiment with the layer 102 being amorphous carbosilane, the oxidized layer 107 formed by the oxidation (step 208) or the post-functionalization oxidation is or includes amorphous carboxysilane. In general, the oxidation (step 208) and the post-functionalization oxidation are bulk reactions that affect the bulk of the coating 101. In one embodiment, the degree of oxidizing is controlled by increasing or decreasing the temperature within the chamber, the exposure time within the chamber, the type and/or amount of diluent gases, pressure, and/or other suitable process conditions. Control of the degree of the oxidizing increases or decreases the amount and/or depth of the oxidized layer 107 and, thus, the wear resistance and/or hardness of the coating 101.

Suitable oxidation reagents for the oxidation (step 208) or the post-functionalization oxidation include, but are not limited to, water (alone, with zero air, or with an inert gas), oxygen, air (alone, not alone, and/or as zero air), nitrous oxide, ozone, peroxide, or a combination thereof. As used herein, the term "zero air" refers to atmospheric air having less than about 0.1 ppm total hydrocarbons. In one embodiment, the oxidation reagent consists of gaseous reagents. Due to the gaseous processing agents (for example, dimethylsilane and/or nitrogen) being in the gas phase, use of the gaseous oxidation reagent results in simpler scale-up for manufacturing, a more transferable process, and a more economical process.

The oxidation reagent used for the oxidation (step 208) or the post-functionalization oxidation is introduced at any suitable operational conditions permitting the formation of the oxidized layer 107. Suitable operational conditions include, but are not limited to, being in the presence of an inert gas, being at a predetermined pressure (for example, between about 1 to 200 psia), being subjected to a predetermined temperature (for example, about 450° C.), being for a predetermined period (for example, for about two hours), other parameters as are described above with reference to the decomposition (step 204), or a combination thereof.

In one embodiment, depending upon the selected species of the oxidation reagent, additional features are present, for example, for safety purposes. Such features include the chamber having a size, weight, and/or corrosion-resistance permitting reactions to occur safely. In one embodiment, to safely inject water into the chamber as the oxidation reagent, substantial cooling is used. For example, in embodiments with the chamber operating at temperature of greater than about 300° C., the chamber is first cooled below about 100° C., which is capable of resulting in a drain on energy and/or time of manufacturing resources.

The oxidized layer 107 formed by the oxidation (step 208) or the post-functionalization oxidation includes properties corresponding to the oxidation reagent used and the operational parameters. In one embodiment, in comparison to the layer 102 and/or the functionalized layer 110, the oxidized layer 107 is over-oxidized and/or has a contact angle on a Si wafer of about 60° has an increased amount of N—H, Si—OH, and/or C—OH groups, has fragile scratch resistance, has increased acid resistance, has increased corrosion resistance, or a combination thereof.

The oxidized layer 107 includes various comparative properties relative to the layer 102, the functionalized layer 110, and/or embodiments with the oxidized layer 107 being formed by different oxidation reagents. For example, the oxidized layer 107 has decreased chemical resistance, has decreased scratch resistance, has decreased hardness, or a combination thereof. In one embodiment, the oxidized layer 107 is oxidized and/or has a contact angle on a Si wafer of about 86.6° has decreased friction (for example, in comparison to embodiments with the oxidizing reagent being zero air and water), has decreased wear resistance (for example, in comparison to embodiments with the oxidizing reagent being zero air and water), includes Si—O—Si groups (for example, capable of being shown by FT-IR data having a growth of the Si—O—Si peak at 1026.9 $cm^{-1}$ compared to the non-water functionalized peak at 995.2 $cm^{-1}$), or a combination thereof. In one embodiment, the oxidized layer 107 is over-oxidized, has a decreased amount of C—H groups (for example, in comparison to embodiments with the oxidizing reagent being water alone), has a decreased amount of Si—C groups (for example, in comparison to embodiments with the oxidizing reagent being water alone), has an increased amount of Si—OH/C—OH groups (for example, in comparison to embodiments with the oxidizing reagent being water alone), or a combination thereof. In one embodiment, the oxidized layer 107 has lower coefficient of friction (for example, in comparison to embodiments with the oxidation agent being zero air and water), has increased wear resistance (for example, in comparison to embodiments with the oxidation agent being zero air and water), includes Si—O—Si groups, or a combination thereof.

The layer 102 has a first contact angle and the functionalized layer 110 has a second contact angle. In an embodiment without the oxidation (step 208) of the layer 102, the first contact angle is lower than the second contact angle, for example, the first contact angle being about 98.3° advancing on 304 stainless steel and the second contact angle being about 100° advancing on 304 stainless steel. In an embodiment with the post-functionalization oxidation of the functionalized layer 110, the first contact angle is higher than the second contact angle, for example, the first contact angle being about 95.6° advancing on 304 stainless steel and the second contact angle being about 65.9° receding on 304 stainless steel. In the embodiment with the oxidation (step 208) of the functionalized layer 110, the functionalized layer 110 includes Si—O—Si groups and a decreased amount of Si—H groups (for example, in comparison to the functionalized layer 110 that is not oxidized).

In one embodiment, the coefficient of friction is decreased by the oxidation (step 208). For example, in an embodiment with the oxidation (step 208) of the layer 102, the layer 102 includes a first coefficient of friction (for example, about 0.97) prior to the oxidation (step 208) and a second coefficient of friction (for example, about 0.84) after the oxidation (step 208).

In one embodiment, the wear rate is decreased by the oxidation (step 208). For example, in an embodiment with the oxidation (step 208) of the layer 102, the layer 102 includes a first wear rate (for example, $4.73 \times 10^{-4}$ mm$^3$/N/m) prior to the oxidation (step 208) and a second wear rate (for example, about $6.75 \times 10^{-5}$ mm$^3$/N/m) after the oxidation (step 208).

Figure 9:
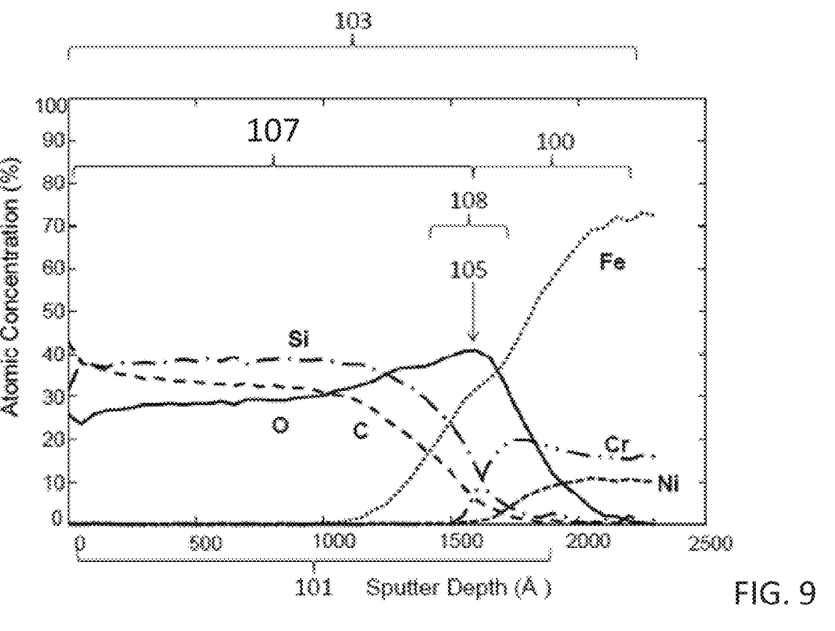
FIG. 9 shows an Auger Electron Spectroscopy plot of an article having a layer formed from decomposition of material followed by oxidation with water according to an embodiment of the disclosure.

In one embodiment including the oxidation (step 208) using water as the oxidant, the article 103 includes a composition as is shown in the Auger Electron Spectroscopy plot of FIG. 9 or a similar variation thereof.

The post-oxidation functionalization (step 210) is or includes any features of the functionalization (step 206) as are described above. Additionally or alternatively, the post-oxidation functionalization (step 210) includes thermal coupling of one or more materials. In one embodiment, the thermal coupling is of trimethylsilane to the surface 105 (for example, by using disilylhydride or trisilylhydride functionality). In one embodiment, the thermal coupling is of an organofluorotrialkoxysilanes or an organofluorosilylhydrides (for example, decreasing operating costs due to low material costs and/or increasing production feasibility).

Figure 10:
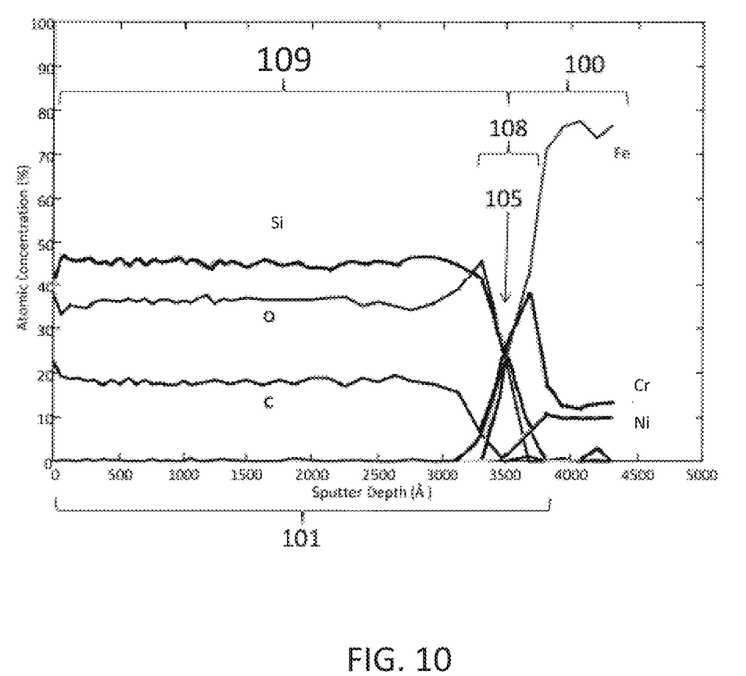
FIG. 10 shows an Auger Electron Spectroscopy plot of an article having an oxidized-then-functionalized layer formed according to an embodiment of the disclosure.

In one embodiment, the post-oxidation functionalization (step 210) modifies the oxidized layer 107, for example, by heating and/or modifying the surface, to form the oxidized-then-functionalized layer 109 shown in FIGS. 6-7 (such as, an organofluoro treated layer), for example, as is illustrated by the Auger Electron Spectroscopy plot of FIG. 10 or similar plots. Heat, exposure times, diluent gases, and pressures are adjusted to affect the degree of post-oxidation functionalization (step 210). Control of this degree of the post-oxidation functionalization (step 210) imparts predetermined properties. In one embodiment, the oxidized layer is exposed to an organosilane reagent at a temperature of about 300° to 600° C., for about 1 to 24 hours and at a pressure of about 5 to 100 psia, in some cases about 25 psia, about 27 psia, about 54 psia, or any suitable ranges there between. In one embodiment, inert diluent gases are used, such as argon or nitrogen, for example, at partial pressures of about 1 to 100 psia to assist the reaction.

In one embodiment, the oxidized-then-functionalized layer 109 is formed by applying the organofluoro treatment, where the organofluoro treatment is $(R)_{1-3}Si(X)_{1-3}$, where R equals an organofluoro group and X equals —H, —OH, —OR' (R' being an alkyl group or alkoxy group, such as a methoxy group, ethoxy group, or butoxy). Additionally or alternatively, R and/or R' correspond with any suitable group, including, but not limited to, an alkyl, aryl, halogenated alkyl and aryl, ketone, aldehyde, acyl, alcohol, epoxy, and nitro-organo, organometallic functionality, or combination thereof. Additionally or alternatively, in one embodiment, the oxidized-then-functionalized layer 109 is formed by the organofluoro treatment including an organofluoro silyl (for example, tridecafluoro 1,1,2,2-tetrahydrooctylsilane), any suitable organofluoro alcohol (for example, pentafluoropropanol), any suitable fluorosilane, or a combination thereof. In one embodiment, the fluorosilane has the following general formula:

In this embodiment, X represents H or alkoxy group (including, for example, methoxy, ethoxy, or butyoxy), Y represents X or R constituents, Z represents X or R constituents, and R represents an organo fluoro functional group having the structure $CF_3(CH_2)_n$.

In one embodiment, the oxidized-then-functionalized layer 109 has increased oleophobicity and/or hydrophobicity. In one embodiment, the oxidized-then-functionalized layer 109 has a contact angle for deionized water on a mirror surface of greater than about 50°, greater than about 55°, greater than about 60°, greater than about 65°, between about 60° and about 70°, about 60°, about 62°, about 65°, about 67°, 61.7°, 67.4°, 74.7°, or any suitable range, sub-range, combination, or sub-combination thereof. Additionally or alternatively, in one embodiment, the post-oxidation functionalization (step 210) results in a contact angle for deionized water on a mirror surface that is greater than polytetrafluoroethylene, for example, by at least about 30°, at least about 40°, at least about 60°, between about 30° and about 60°, or any suitable range, sub-range, combination, or sub-combination thereof.

In one embodiment, the oxidized-then-functionalized layer 109 has a contact angle for 10W40 motor oil on a rough surface of greater than about 80°, greater than about 90°, greater than about 100°, greater than about 105°, between about 80° and about 110°, about 80°, about 81°, about 100°, about 105°, 81.0°, 100.2°, 105.1°, or any suitable range, sub-range, combination, or sub-combination thereof. Additionally or alternatively, in one embodiment, the oxidized-then-functionalized layer 109 has a contact angle on a rough surface that is greater than polytetrafluoroethylene, for example, by at least about 10°, at least about 15°, at least about 20°, between about 10° and about 25°, or any suitable range, sub-range, combination, or sub-combination thereof.

In one embodiment, the oxidized-then-functionalized layer 109 has a contact angle for deionized water on a mirror surface of greater than about 105°, greater than about 110°, greater than about 112°, between about 100° and about 114°, about 110.3°, about 112.1°, about 113.7°, or any suitable range, sub-range, combination, or sub-combination thereof. Additionally or alternatively, in one embodiment, the oxidized-then-functionalized layer 109 has a contact angle for deionized water on a mirror surface that is less than polytetrafluoroethylene, for example, by about 1°, about 2°, between about 1° and about 2°, or any suitable range, sub-range, combination, or sub-combination thereof.

In one embodiment, the oxidized-then-functionalized layer 109 has a contact angle for deionized water on a rough surface of greater than about 140°, greater than about 145°, between about 140° and about 150°, about 142.7°, about 145.7°, about 148.1°, or any suitable range, sub-range, combination, or sub-combination thereof. Additionally or alternatively, in one embodiment, the oxidized-then-functionalized layer 109 has a contact angle for deionized water on a rough surface that is greater than polytetrafluoroethylene, for example, by about 25°, about 30°, between about 20° and about 35°, or any suitable range, sub-range, combination, or sub-combination thereof.

In one embodiment, the oxidized-then-functionalized layer 109 has greater anti-stiction properties than the functionalized layer 110, for example, formed with dimethylsilane, and/or the oxidized layer 107, for example, formed with zero air as the binding reagent. As such, in one embodiment of the coating process 200, the oxidized-then-functionalized layer 109 has increased anti-stiction.

By modifying and varying the R-groups, or by using other molecules capable of hydroxyl reactivity, surface properties of the oxidized-then-functionalized layer 109 are adjusted. For example, in one embodiment, the adjustments increase or decrease hardness and anti-stiction, wear resistance, inertness, electrochemical impedance, contact angle, or a combination thereof, thereby providing physical performance characteristics expanding the applicability and durability for use in the fields of process, analytical, gas, oil and semiconductor industries.

In particular, the semiconductor industry includes various product categories capable of being produced in fabrication processes that include contacting fluid materials (for example, gasses or plasma) with the layer 102, the oxidized layer 107, the oxidized-then-functionalized layer 109, the functionalized layer 110, or a combination thereof. Such products include, but are not limited to, memory, microprocessors, integrated circuits, and systems on a chip (SOC). Memory chips serve as temporary storehouses of data and pass information to and from computer devices' brains. Microprocessors are central processing units that contain the basic logic to perform tasks. Commodity integrated circuits, sometimes referred to as "standard chips" are used for routine processing purposes. SOCs relate to a complex integrated circuit chip with an entire system's capability on it.

Semiconductors from each of the various product categories are used in virtually every industry. Thus, embodiments of the semiconductor fabrication process encompass producing semiconductor products in which electronic devices and integrated circuits are used, such as, but not limited to computer sciences, control of industrial processes, energy technology, information technology, consumer electronics, medical diagnostics, illumination technology, transportation technology, and communications technology. In one embodiment, such semiconductor products produced by the semiconductor fabrication process have compactness, reliability, and low cost. Additionally, in one embodiment, the semiconductor products are able to handle a wide range of current and voltage and have the ability to be integrated into complex but readily manufactured modules.

In one embodiment, the semiconductor products produced by the semiconductor fabrication process include, but are not limited to, two-terminal devices, three-terminal devices, four-terminal devices, and multi-terminal devices. Two-terminal devices include, but are not limited to, DIAC, diode (rectifier diode), Gunn diode, IMPATT diode, laser diode, light-emitting diode (LED), photocell, PIN diode, Schottky diode, solar cell, Tunnel diode, VCSEL, VECSEL, and Zener diode. Three-terminal devices include, but are not limited to, bipolar transistor, Darlington transistor, field-effect transistor, insulated-gate bipolar transistor (IGBT), silicon controlled rectifier, thyristor, TRIAC, and unijunction transistor. Four-terminal devices include, but are not limited to, Hall effect sensor (magnetic field sensor). Multi-terminal devices include, but are not limited to, integrated circuit (ICs), charge-coupled device (CCD), microprocessor, random-access memory (RAM), and read-only memory (ROM).

In one embodiment, semiconductor products produced by the semiconductor fabrication process include a solid material having a regular, periodic structure of individual atoms bonded together. The solid material includes, but is not limited to, a crystalline solid, a poly-crystalline material, or a combination thereof. Other semiconductor materials include, but are not limited to, amorphous materials and liquids. In one embodiment, the semiconductor product produced by the semiconductor fabrication process is an intrinsic semiconductor. In another embodiment, the semiconductor product produced by the semiconductor fabrication process includes an intrinsic semiconductor material that is chemically very pure and possesses poor conductivity. The intrinsic semiconductor material has equal numbers of negative carriers (electrons) and positive carriers (holes). In an alternate embodiment, the semiconductor product produced by the semiconductor fabrication process is an extrinsic semiconductor.

The substrate of the extrinsic semiconductor includes the intrinsic semiconductor material having a small amount of impurities added by a process, known as doping, which alters the electrical properties of the semiconductor and improves its conductivity. The introduction of impurities through the doping process provides control over the conductivity of the semiconductor material. The doping process produces two groups of semiconductors: a negative charge conductor (n-type) and a positive charge conductor (p-type). The semiconductors are available as either elements or compounds. In addition to pure element semiconductors, such as, but not limited to, silicon (Si), germanium (Ge) and carbon (C), many alloys and compounds are semiconductors, such as, but not limited to, indium antimonide (InSb), indium arsenide (InAs), indium phosphide (InP), gallium phosphide (GaP), gallium antimonide (GaSb), gallium arsenide (GaAs), silicon carbide (SiC), gallium nitride (GaN), silicon germanium (SiGe), and selenium sulfide (SeS).

In one embodiment, the R-groups are formed by hydrocarbons, substituted hydrocarbons, carbonyls, carboxyls, esters, ethers, amines, amides, sulfonic acids, organometalic complexes, and/or epoxides. Although not intending to be bound by theory, it is believed that the moieties of silicon hydride can thermally react, via a hydrosilyation mechanism, with unsaturated hydrocarbon groups to covalently bond to the surface of the coated substrate. In one embodiment, the coating 101 on all exposed surfaces within the reaction chamber includes covalently-bound R-groups, which include the R-group and carbon, silicon, and hydrogen moieties.

In one embodiment, the oxidized-then-functionalized layer 109 (for example, formed by exposing a dimethylsilane-based carboxysilane layer formed by air-oxidizing the layer 102 prior to the organoflouoro treatment) includes a loss of Si—OH functionality (in comparison to an embodiment of the oxidized layer 107 with zero air oxidizing, based upon a FT-IR peak at 3401.8 cm$^{-1}$), an increase in contact angle measurement (for example, about 111° for deionized water on a mirror-smooth surface in comparison to about 50.9° prior to the post-oxidation functionalization (step 210)), a presence of hydrophobicity, excellent impedance (for example, at low frequency ($Z_{lf}$)) of about 1.00 Mohm (increased from a $Z_{lf}$=about 7.27 kohm from the oxidized layer 107 with zero air oxidizing), and/or a terminal $Z_R/Z_I$ ratio of about 0.0.821 from a Nyquist plot, or a combination thereof.

Figure 11:
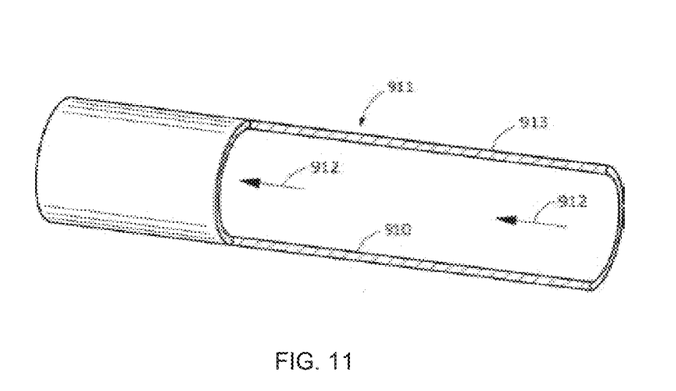
FIG. 11 shows an application with a surface coated according to an embodiment of the disclosure.

In one embodiment, the coating 101, the layer 102, the functionalized layer 110, and/or the oxidized-then-functionalized layer 109 include(s) anti-stiction properties, for example, on any suitable surface, for example, one or more of the surfaces illustrated in FIG. 11. FIG. 11 illustrates a portion of a system in which a fluid surface 910 is contacted by a moving fluid during the production of a semiconductor product from the system and/or during monitoring of the system. In one embodiment, the fluid surface 910 is the interior of a flexible or rigid tube or pipe 911, through which a fluid such as gas and/or liquid flow(s), as indicated by arrows 912, or any other part in contact with the fluid and in fluid motion. FIG. 12 also illustrates an outer surface 913, which has a different composition or the same as the fluid surface 910.

In one embodiment, the coating 101, the layer 102, the functionalized layer 110, and/or the oxidized-then-functionalized layer 109 include(s) resistance to erosion (for example, from both solids and liquids) and corrosion. Resistance to erosion occurs in spite of an impinging particle or stream contacting the surface. Resistance to corrosion occurs by preventing surfaces from reacting with the environment and/or reaction products being formed as surface asperities. Such resistance prevents attrition of the reaction products from occurring as a result of crack formation and/or abrasion in the contact interactions of the materials.

The following Examples show various elements relating to the disclosure. Properties and parameters disclosed within the Examples should be considered as being disclosed within the Detailed Description of the Invention, whether comparative in nature or illustrative in nature.

EXAMPLE 1

A first example includes introducing dimethylsilane to the substrate 100 for 2 hours at 8 psia gas at 450° C. to form the layer 102. The layer 102 is almost undetectable (i.e., very difficult to visually discern) on a mirror-polished 316 stainless steel coupon (slightly yellowed). Measurements show water contact angle data prior to the deposition treatment at around 60°. After the deposition treatment with dimethylsilane, the contact angle increases to around 102°. Although the layer 102 is not visible, the data indicates an extremely thin deposition with a significant density of carbosilyl material on the layer 102 of the surface 105. The thickness of the layer 102 is estimated to be at about 100 Angstroms, as available spectroscopic techniques are not sensitive enough to detect the coating.

EXAMPLE 2

The second example includes introducing dimethylsilane to the substrate 100 for 15 hours at 8 psia gas at 450° C. to form the layer 102. The layer 102 has a visible luminescent rainbow array of colors.

EXAMPLE 3

The third example includes introducing dimethylsilane to the substrate 100 for 15 hours at 8 psia gas at 450° C. to form the layer 102 and subsequently oxidizing the layer 102 of the substrate 100 with water in an inert gas for 2 hours at about 100 to 200 psia gas at 450° C. to form the oxidized layer 107. The third example shows undesirable results, such as a lack of functional moieties (Si—OH or Si—H) for surface modification chemistry.

EXAMPLE 4

The fourth example includes introducing dimethylsilane to the substrate 100 for 15 hours at 8 psia gas at 450° C. to form the layer 102 and subsequently oxidizing the layer 102 of the substrate 100 with an oxidation reagent mixture for 2 hours at about 100 to 200 psia gas at 300° C. to form the oxidized layer 107 with zero air oxidizing. The oxidation reagent mixture includes zero air and water. The oxidized layer 107 shows undesirable results, such as, in comparison to Example 3, being over-oxidized, having a decrease of C—H groups, having a decrease of Si—C groups, and having an increase of Si—OH/C—OH groups.

EXAMPLE 5

The fifth example includes introducing dimethylsilane to the substrate 100 for 15 hours at 8 psia gas at 450° C. to form the layer 102 and subsequently oxidizing the layer 102 on the substrate 100 with zero air for 2 hours at about 1 to 200 psia gas at 300° C. to form the oxidized layer 107. The oxidized layer 107 includes an oxidized carbosilane material with a significant Si—OH stretch observed in the FT-IR data (broad; 3414 cm$^{-1}$). Contact angle is measured to be 50.9° for deionized water. Electrochemical impedance spectroscopy shows impedance at low frequency $Z_{lf}$=about 7.27 kohm. Wear resistance of the material analyzed with a Tribometer (CSM Instruments S/N 18-343) applying a 0.5 N force via a standard 100 Cr6 ball and circular linear speed of 3.00 cm/s thereby shows a 4.141×10$^{-3}$ wear (mm$^3$/N m). In comparison to Example, 3, the oxidized layer 107 has lower friction, higher wear, and a presence of Si—O—Si groups.

EXAMPLE 6

The sixth example includes functionalizing the layer 102 formed in Example 2 with ethylene to form the functionalized layer 110. The functionalized layer 110 has a water contact angle of 98.3° advancing and 85.1° receding on 304 stainless steel. FT-IR data shows little oxidation based upon a lack of Si—O—Si groups (based upon a stretch at 1027 cm$^{-1}$) and decreased an amount of Si—H groups (based upon a stretch at 2091 cm$^{-1}$).

EXAMPLE 7

The seventh example includes functionalizing the layer 102 formed in Example 2 with ethylene to form the functionalized layer 110. Then, the functionalized layer 110 is oxidized by 5 ml deionized water (DI) being added to the chamber. The chamber is exposed to several nitrogen flushes and mild vacuum to remove zero air from the sealed container. The temperature in the chamber is held at 450° C. for about 2 hours, then returned to room temperature. The oxidation of the functionalized layer 110 forms the functionalized-then-oxidized layer 111. The functionalized-then-oxidized layer 111 has a water contact angle data of 95.6° advancing and 65.9° receding. FT-IR data shows that oxidation increases an amount of Si—O—Si groups (based upon a stretch at 1027 cm$^{-1}$) and decreases an amount of Si—H groups (based upon a stretch at 2091 cm$^{-1}$) in comparison to the functionalized layer 110 formed in Example 6.

EXAMPLE 8

The eighth example includes introducing trimethylsilane to the layer 102 (formed by deposition of dimethylsilane) for 15 hours at 8 psia gas at 450° C. The eighth example shows undesirable results, including no visible or spectroscopically measurable coating on the substrate 100, nor any indication of a molecular coating as there is no significant change in water contact angle values.

EXAMPLE 9

The ninth example includes adding trimethylsilane to an evacuated chamber including the material at 450° C. and 25 psia and reacted for about 10 hours. Resultant FT-IR data shows a loss of Si—OH functionality. Contact angle is measured to be 99.1° for deionized water, suggesting a presence of hydrophobicity. Electrochemical impedance spectroscopy shows impedance at low frequency ($Z_{lf}$) of 15.4 Mohm. Electrochemical impedance spectroscopy also shows a Bode plot and terminal $Z_R/Z_I$ ratio of 0.072 from a Nyquist plot. Wear resistance of the material is analyzed with a Tribometer (CSM Instruments S/N 18-343) applying a 0.5 N force via a standard 100 Cr6 ball and circular linear speed of 3.00 cm/s thereby showing a $1.225 \times 10^{-4}$ wear ($mm^3/Nm$), a thirty-four-fold increase in comparison to the non-treated material.

EXAMPLE 10

The tenth example includes tridecafluoro 1,1,2,2-tetrahydrooctylsilane being added to the oxidized layer 107 at first conditions of 450° C. for about 10 hours, second conditions of 350° C. for about 7 hours, third conditions of 375° C. for about 7 hours, and fourth conditions of 400° C. for about 7 hours.

Under the first conditions, the resulting contact angle is 108.26° advancing and 61.03° receding on 304 stainless steel and the resulting coating includes excellent scratch resistance and a high degree of electrical impedance at low frequency (EIS Zlf=10.24 MOhm). There is also a noted resistance to corrosion in hydrochloric acid exposure (6M at room temperature for 24 hours) where the high hydrophobicity is retained even after rigorous acid exposure. The appearance of a brown coating on a borosilicate glass sample may be an indicator of decomposition of the organofluoro reagent at 450° C. Under the second conditions, the resulting contact angle is 111.62° advancing and 95.12° receding on 304 stainless steel and the resulting coating includes excellent scratch resistance and a lower EIS impedance at low frequency (Zlf=167 kohm). This may be an indication of an incomplete reaction with the oxidized layer, however, the high contact angle verifies at least a partial bonding of the organofluoro reagent. The borosilicate glass liner has a colorless appearance indicating no significant thermal decomposition of the organofluoro reagent. Goniometer contact angles also indicate a high degree of oleophobicity, whereby a 10W40 motor oil contact angle is measured at 84.8° on a mirror-polished 316 stainless steel coupon. Under the third conditions, the resulting contact angle is 112.67° advancing and 102.29° receding on 304 stainless steel and the resulting coating includes excellent scratch resistance and improved EIS data over prior conditions at 350° C. (Zlf=1.0 Mohm). There is no indication of a brown residue on the glass surface, so there is no indication of thermal decomposition of the organofluoro reagent, yet the improved EIS data indicates a more complete reaction. Good oleophobicity is maintained as well, whereby a contact angle with 10W40 motor oil is 80.5°. Additionally, the thermal oxidative resistivity of this surface is tested by placing a coated coupon in 450° C. oven in room air. The water contact angle for that coupon prior to thermal oxidation exposure was 113.8° and after exposure decreased only to 110.6°. This indicates a high degree of resistance to thermal oxidation, which is a highly beneficial characteristic for application in combustion and fouling environments where coke and fouling accumulation is a key concern. Under the fourth conditions, the resulting contact angle is 112.14° advancing and 94.47° receding on 304 stainless steel and the resulting coating includes excellent scratch resistance and improved EIS data (Zlf=2.61 Mohm). However, the oleophobicity decreases, with a 10W40 motor oil contact angle of 64.0°, indicating initial decomposition of the organofluoro reagent, despite a clear, colorless appearance of the glass coupon.

EXAMPLE 11

The eleventh example includes adding fluorosilane to the oxidized layer 110 at 450° C. and 30 psia for about 7 hours to form the oxidized-then-functionalized layer 109, as is measurable by contact angle being from about 135° to about 163° for deionized water, suggesting hydrophobicity.

EXAMPLE 12

The twelfth example includes adding 2,2,3,3,3-pentafluoro-1-propanol to the oxidized layer 107 at 400° C. for about 10 hours. The resulting contact angle is 92.22° advancing and 66.12° receding. The resulting coating includes shows it is possible to functionalize the oxidized deposition via an alcohol (C—OH) moiety. This is confirmed by a high contact angle and reasonably high EIS impedance at low frequency (Zlf=1.93 Mohm). Long-term EIS data which involves leaving the coated surface exposed to a 5% NaCl solution shows a decline in impedance. This is indicative of the corrosive effects of a salt solution on the coating and a non-optimal performance of material.

EXAMPLE 13

The thirteenth example includes adding 2,2,3,3,3-pentafluoro-1-propanol to the oxidized layer 107 at 450° C. for about 10 hours. The resulting contact angle is 97.92° advancing and 51.05° receding. A thinner deposition of base carboxysilane material and more moles of organofluoro reagent (compared to Example 12) yields an inferior surface with poor EIS performance (Zlf=56.2 kohm).

EXAMPLE 14

The fourteenth example includes adding 2,2,3,3,3-pentafluoro-1-propanol to the unoxidized layer at 400° C. for about 4 hours. The resulting contact angle is 105.67° advancing and 46.66° receding on 304 stainless steel. EIS data indicates a high impedance at low frequency (Zlf=17.8 Mohm) and a noted decline in scratch resistance compared to oxidized depositions. A coupon is then oxidized in 50 psia Zero Air for 2 hours at 300° C. Contact angle then decreases significantly to 54.8° as does the EIS impedance (Zlf=11.2 kohm). Scratch resistance of the post-oxidized coating is excellent. Although this indicates the possibility of functionalizing a carbosilane deposition (via Si—H) moieties with an organofluoro alcohol (via C—OH functionalities), post oxidation of this product results in improved scratch resistance, but to the detriment of hydrophobicity and electrical impedance.

EXAMPLE 15

The fifteenth example includes adding allylheptafluoroisopropyl ether to the carbosilane (i.e. non-oxidized) layer 102 at 400° C. for about 4 hours. The resulting coating includes poor adhesion and poor scratch resistance. This is an attempt to bond to the carbosilane Si—H moieties via thermal hydrosilylation to an alkene-functional organofluoro reagent. The glass sample has a dark, flaking coating which is easily removed via ultrasonication in DI water. The uncoated glass has a frosted appearance, indicating a decomposition of the organofluoro reagent, formation of hydrogen fluoride, and an etch of the glass. It is concluded that at lower functionalization temperature may improve the results.

EXAMPLE 16

The sixteenth example includes adding allylheptafluoroisopropyl ether to the layer 102 at 300° C. for about 4 hours. The resulting contact angle is 110.94° advancing and 88.05° receding on 304 stainless steel. The resulting coating includes good adhesion and good scratch resistance. The reasonably high water contact angle indicates some functionalization. Good scratch resistance is also noted, which is unusual as this is not often achieved without an oxidation step. EIS data reveals excellent impedance at Zlf=13.66 Mohm. FTIR data, however, show a reasonably large Si—H stretch at 2096.5 $cm^{-1}$, indicating an incomplete reaction with Si—H moieties in the carbosilane base layer.

EXAMPLE 17

The seventeenth example includes adding (perfluorohexyl)ethylene to the non-oxidized layer 102 at 350° C. for about 7 hours. The resulting contact angle is 107.25° advancing and 92.70° receding on 304 stainless steel. The resulting coating includes excellent adhesion, includes excellent scratch resistance, and is very slippery (having a low coefficient of friction). The hydrosilylation binding mechanism with a highly fluorinated alkene is moderately successful at these conditions, but a significant Si—H stretch is still evident at 2096.3 $cm^{-1}$. The impedance data indicates excellent performance with a Zlf=8.84 Mohm. Oleophobicity is reasonable with a 10W40 motor oil contact angle at 53.3°. Inertness data using long-term holding studies of hydrogen sulfide at 28 ppb concentration indicates excellent inertness. Over three days there is an 88.2% recovery of H2S as tested by gas chromatographic methods (SCD detection).

EXAMPLE 18

The eighteenth example includes adding (perfluorobutyl) ethylene to the layer 102 at 350° C. for about 7 hours. The resulting contact angle is 111.93° advancing and 89.10° receding on 304 stainless steel. The resulting coating includes zero dust and bright colors. In an attempt to react with all Si—H moieties, a smaller organofluoroalkene is used compared to the one in Example 17. FT-IR data still shows significant Si—H at 2101.2 cm-1, and EIS data reveals a worse impedance at low frequency (Zlf=1.16 Mohm).

EXAMPLE 19

The nineteenth example includes adding (perfluorohexyl) ethylene to the non-oxidized layer 102 at 325° C. for about 7 hours. The resulting contact angle is 108.62° advancing and 99.21° receding on 304 stainless steel. The resulting coating includes excellent deposition and excellent scratch resistance. The lower temperature (compared to Example 17) does not improve the reactivity with Si—H moieties nor EIS test results (Zlf=4.77 Mohm).

EXAMPLE 20

The twentieth example includes adding (perfluorooctyl) ethylene to the layer 102 at 325° C. for about 7 hours. The resulting contact angle is 112.82° advancing and 89.35° receding on 304 stainless steel. A larger organofluoro alkene reagent (compared to Example 17) provides no additional benefit to contact angle or EIS impedance (Zlf=6.63 Mohm). Subsequent inertness analyses for hydrogen sulfide adsorptivity (using holding studies at 28 ppb concentration) exhibits worse performance than Example 17.

EXAMPLE 21

The twenty-first example includes adding tridecafluoro 1,1,2,2-tetrahydrooctyltriethoxysilane to the oxidized layer 107 at 375° C. for about 7 hours. The resulting contact angle is 113.9° on 316 stainless steel. The use of an alkoxysilane-functional organofluoro reagent to functionalize the oxidized deposition provides a significant cost-savings over the hydrosilane-functional organofluoro analogue in Example 10. The thermal oxidative stability of this material is excellent, where the contact angle after 30 min of exposure to 450° C. in air yields a decrease in water contact angle to 106.6°. A total of 60 min exposure to 450° C. in air yields a water contact angle of 102.2. This robust characteristic may be highly desirable in anti-coking, anti-fouling and anti-stiction environments that are subjected to heat in oxidative environments.

EXAMPLE 21

The twenty-first example includes adding trifluoropropyl trimethoxylsilane to the layer 102 at 375° C. for about 7 hours. The resulting contact angle is 98.3° advancing and 59.3° receding on 304 stainless steel. The use of a smaller trifluoropropyl reagent indicates inferior hydrophobicity that the larger analogues. Additionally, thermal oxidation resistivity is inferior with a water contact angle decreasing to 70.1° after exposure to 450° C. in air for 30 minutes. There is reasonable reactivity with the methoxy-functional analogue (Example 20), but not obvious advantage in cost or performance.

While only certain features and embodiments of the invention have been shown and described, many modifications and changes may occur to those skilled in the art (for example, variations in sizes, dimensions, structures, shapes and proportions of the various elements, values of parameters (for example, temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A semiconductor fabrication process, comprising:
providing a coated article, the coated article having a substrate and a layer applied to the substrate by decomposition and then oxidization of dimethylsilane through chemical vapor deposition, the layer applied by a fluid material; and then
positioning the coated article in a system for producing a semiconductor product.

2. The process of claim 1, wherein the layer is applied to an oxidized layer, a pretreated layer, or a combination thereof.

3. The process of claim 2, wherein the oxidized layer includes an oxidized carbosilane material.

4. The process of claim 2, wherein the oxidized layer is formed by water, zero air, or a combination thereof.

5. The process of claim 2, wherein the oxidized layer includes oxidized dimethylsilane.

6. The process of claim 5, wherein the layer includes trimethylsilane applied to the oxidized dimethylsilane.

7. The process of claim 1, wherein the fluid material is a gas.

8. The process of claim 1, wherein the fluid material is a plasma.

9. The process of claim 1, wherein the coated article is a tube and the layer is an internal surface of the tube.

10. The process of claim 1, wherein the coated article is a fitting and the layer is an internal surface of the fitting.

11. The process of claim 1, wherein the coated article is a pipe and the layer is an internal surface of the pipe.

12. The process of claim 1, wherein the coated article is a chamber and the layer is an internal surface of the chamber wall.

13. The process of claim 1, wherein the semiconductor product comprises a crystalline solid, a poly-crystalline material, or an amorphous material.

14. The process of claim 1, wherein the semiconductor product includes an intrinsic semiconductor.

15. The process of claim 1, wherein the semiconductor product includes an extrinsic semiconductor having a positive charge conductor.

16. The process of claim 1, wherein the semiconductor product is selected from the group consisting of a pure element semiconductor and a compound semiconductor.

17. The process of claim 1, wherein the semiconductor product includes a surface consisting of indium antimonide (InSb), indium arsenide (InAs), indium phosphide (InP), gallium phosphide (GaP), gallium antimonide (GaSb), gallium arsenide (GaAs), silicon carbide (SiC), gallium nitride (GaN), silicon germanium (SiGe), or selenium sulfide (SeS).

18. A semiconductor fabrication process, comprising:
providing a coated article, the coated article having a substrate and a layer applied to the substrate by decomposition and then oxidization of dimethylsilane through chemical vapor deposition, the layer applied by a fluid material; and then
positioning the coated article in a system; and then
producing a semiconductor product from the system.

19. A semiconductor fabrication process, comprising:
providing a layer applied by decomposition and then oxidization of dimethylsilane through chemical vapor deposition, the layer applied by a fluid material; and then
positioning the layer in a system; and then
producing a semiconductor product from the system.

* * * * *